United States Patent [19]

Yatsuzuka et al.

[11] Patent Number: 4,470,146
[45] Date of Patent: Sep. 4, 1984

[54] ADAPTIVE QUANTIZER WITH INSTANTANEOUS ERROR ROBUSTNESS

[75] Inventors: Yohtaro Yatsuzuka, Tokyo, Japan; Henri G. Suyderhoud, Potomac, Md.

[73] Assignee: Communications Satellite Corporation, Washington, D.C.

[21] Appl. No.: 373,549

[22] Filed: Apr. 30, 1982

[51] Int. Cl.³ .......................................... H03K 13/22
[52] U.S. Cl. ....................... 375/30; 358/135; 332/11 D
[58] Field of Search ................ 375/27, 30, 31, 32, 375/33; 179/1 SA, 1 SC, 15, 55 R; 358/13, 135; 332/11 D; 340/347 AD

[56] References Cited

U.S. PATENT DOCUMENTS

| | | | |
|---|---|---|---|
| 3,973,199 | 8/1976 | Widmer | 332/11 D |
| 4,075,655 | 2/1978 | Iijima et al. | 375/31 |
| 4,109,203 | 8/1978 | Eggermont et al. | 375/30 |
| 4,179,710 | 12/1979 | Ishiguro et al. | 358/135 |
| 4,184,049 | 1/1980 | Crochiere et al. | 179/1 SA |
| 4,255,763 | 3/1981 | Maxemchuk et al. | 375/135 |
| 4,317,208 | 2/1982 | Araseki et al. | 375/27 |
| 4,319,360 | 3/1982 | Cointot | 375/27 |

OTHER PUBLICATIONS

Jones and West "Adaptive Delta Modulator with Variable Sample Rate" IBM Technical Disclosure Bulletin vol. 15, No. 10, Mar. 1973.

*Primary Examiner*—Robert L. Griffin
*Assistant Examiner*—Stephen Chin
*Attorney, Agent, or Firm*—Sughrue, Mion, Zinn, Macpeak & Seas

[57] ABSTRACT

A robust ADPCM encoder with a modified leaky quantizer and a pair of parallel predictors is provided. A large leakage is initially inserted into the quantization scale adaptation by utilizing a number of most recent multipliers in a modified leaky Jayant quantizer. Using a dual predictor feedback loop, inside predictor coefficients are updated by the step size having unit variance instead of by the quantized prediction error.

14 Claims, 1 Drawing Figure

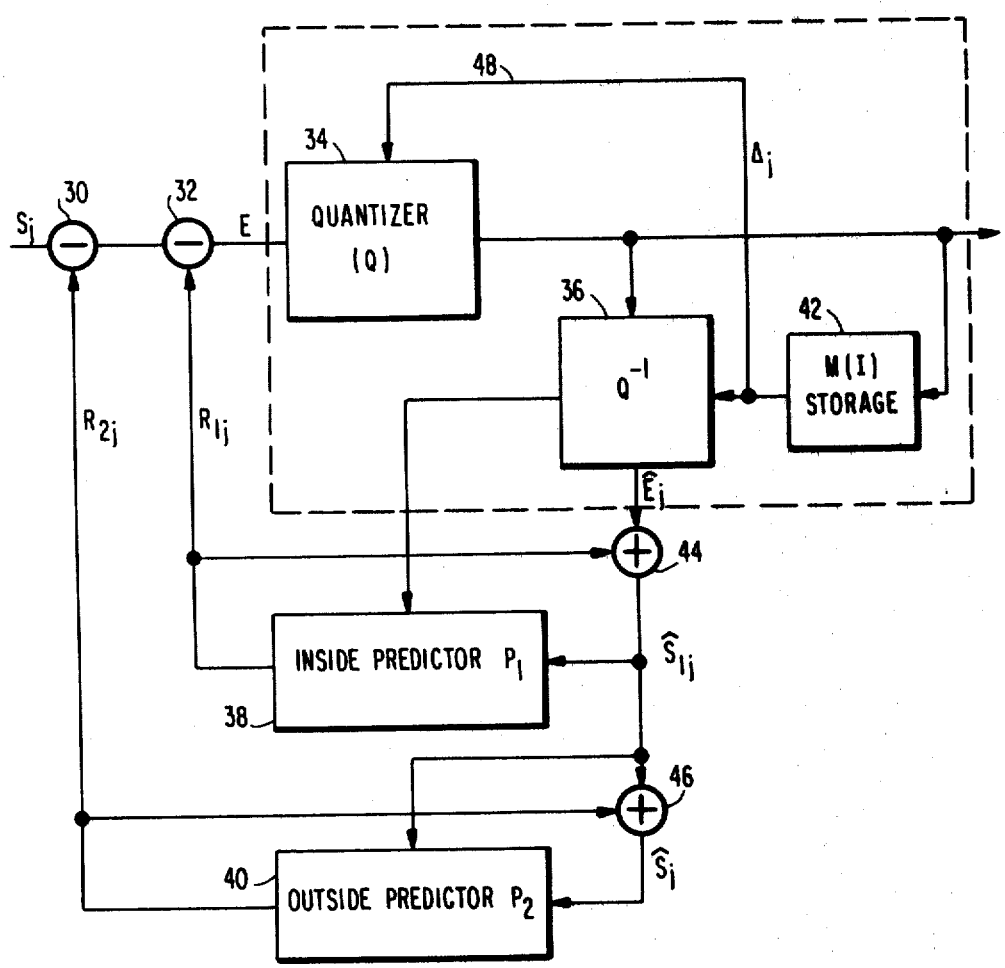

ADAPTIVE QUANTIZER WITH INSTANTANEOUS ERROR ROBUSTNESS

BACKGROUND OF THE INVENTION

The present invention is directed to Adaptive Differential Pulse Code Modulation (ADPCM) encoding, and more particularly to an encoding technique with improved error robustness.

ADPCM encoding has become quite common, and an encoder may have the general configuration wherein a received input signal sample is compared with a predicted value of that signal to produce an error signal which is provided to a quantizer. The quantized error signal is then encoded in a PCM encoder for transmission. Simultaneously, the quantized error signal is fed through an inverse quantizer to recover the error signal which is then supplied to a predictor which generates a prediction of the next signal based upon the most recent history of the signal samples. For an adaptive predictor, the prediction algorithm takes into account the present error signal valve. It is also known to utilize an adaptive quantizer, in which case the error signal is provided to a step size controller which controls the step size used in both the quantizer and inverse quantizer.

Adaptive quantization of a sampled data signal is a well known technique whereby the step size of an n-bit quantizer is varied in order to accommodate a wider dynamic range of the signal source while making most efficient use of the available number of transmission bits. In a system wherein a sample is quantized at each successive sampling instant by n-bits and an adaptive quantizer step size is related to the step size used for quantizing the previous sample, one example of an adaptation algorithm developed by N. S. Jayant, "Adaptive Quantization With One-Word Memory", The Bell System Technical Journal, Vol. 52, No. 7, September 1973, pp. 1119-1144, is $$\Delta_{i+1} = M(I)\Delta_i, \quad (1)$$

where i is the time index for the sampling process, $\Delta_i$ is the quantizer step size and M(I) is a multiplier which depends on the level I at which a sample was quantized. For n quantization bits, I ranges between 1 and $2^{n-1}$.

A disadvantage of this known algorithm is that if, during transmission, an error in the n-bit word has occurred, I' instead of I may be decoded and an incorrect multiplier M'(I) may be used for decoding the next sample. This in turn can lead to an indefinite perpetuation of the decoding error.

In order to overcome these problems of channel bit errors, it has been proposed by Goodman et al "A Robust Adaptive Quantizer", IEEE Trans. Commun. Vol. COM-23, pgs. 1362-1365, November 1975, to add a leakage to the quantizer. Such a leakage can be introduced by modifying equation (1) to:

$$\Delta_{j+1} = \Delta_j^{(1-\alpha)} M(I_j), \quad (2)$$

where $M(I_j)$ is the step size multiplier which is a function of the quantizer output level number $I_j$, and $(1-\alpha)$ is a leakage coefficient provided for the purpose of ensuring decay of the effective channel errors on the step size tracking at the receiving side. $\Delta_j$ is required to be within a specific interval ($\Delta_{max}$, $\Delta_{min}$), and values of $M(I_j)$ may be as suggested by Jayant such that $M(I_j) > 1.0$ when the amplitude of $I_j$ is in the upper part of the quantizing scale, whereas $M(I_j) \leq 1.0$ when $I_j$ is in the lower part of the quantizing scale.

With such a configuration, if the received quantized level $I'_j$ differs from $I_j$ due to a transmission error, the adaptation of the quantizer step size will then use a wrong multiplier $M(I'_j)$ instead of the correct multiplier $M(I_j)$. The step size offset caused by the channel error will decay exponentially in accordance with the leakage coefficient $(1-\alpha)$, but the introduction of this leakage will unfortunately result in a decrease in the adaptation speed, which will further result in an increase in the quantization distortion at low and high input signal levels and a decrease in dynamic range.

It would be desirable, therefore, to provide an adaptive quantizer having a high degree of error robustness but which does not suffer from the limited dynamic range and the decreased S/N.

SUMMARY OF THE INVENTION

It is an object of this invention to provide an adaptive quantizer having a high degree of error robustness without suffering from limited dynamic range or a decreased S/N.

It is a feature of this invention that an adaptive quantizer operates with at least a small leakage at all times and with a large leakage during the occurrence of an error.

It is a further feature of this invention that error robustness is enhanced by operating a pair of predictors in parallel in an ADPCM encoder.

Briefly, the present invention comprises an ADPCM encoder and a quantizer therefore, with the ADPCM encoder employing a pair of adaptive predictors operating in parallel in the feedback path. The coefficients of the predictors are sequentially updated by a steepest decent algorithm, with the outside predictor coefficients being updated by $$a_{j+1}(i) = (1-\beta_2)a_j(i) + g_2 \hat{S}_{1j}\hat{S}_{j-i} / \left( \sum_{h=1}^{4} \hat{S}_{j-h}^2 + 5 \right) \quad (13)$$

$$i = 1, 2,$$

where $1-\beta_2$ is a leakage coefficient to diminish the effect of channel errors on the predictor coefficient, $\hat{S}_{1j}$ is the input signal of the inside predictor, $\hat{S}_j$ is the locally decoded signal, and $g_2$ is a factor introduced to control the convergence rate.

For the inside predictor, the coefficients are updated by $$a_{1j+1}(i) = (1-\beta_1)a_{1j}(i) + g_1 V_j \hat{S}_{1j-i} / \sqrt{\sum_{h=1}^{4} \hat{S}_{1j-h}^2 + 5} \quad (14)$$

$$V_j = \text{sgn}(\hat{E}) \cdot \eta_j \; i = 1, 2,$$

where, as before, $(1-\beta_1)$ represents leakage and $g_1$ is a convergence rate parameter, and $V_j = \text{sgn}(\hat{E}) \cdot \eta_j$ is a quantizer output level with unit variance. Using $V_j$ instead of $\hat{E}_j$ makes the inside adaptive predictor more robust to channel errors than the conventional adaptive algorithm, since $V'_j$ is only corrupted once by a channel error and not at other sampling indices in the decoder.

BRIEF DESCRIPTION OF THE DRAWINGS

The invention will be more clearly understood from the following description in conjunction with the accompanying drawing, wherein the single FIGURE is a block diagram of a robust ADPCM encoder according to the present invention.

DETAILED DESCRIPTION OF THE INVENTION

To improve robustness in the presence of channel errors without sacrificing the dynamic range, a small leakage is included in the quantizer at all times to cause effects of channel errors to decay exponentially, the leakage being small so as to prevent the step size from having a narrow dynamic range, and a large leakage is sporadically inserted into the step size adaptation algorithm upon the occurrence of an error.

Shown in the FIGURE is a block diagram of an ADPCM encoder according to the present invention. The encoder includes first and second subtractors 30 and 32, an adaptive quantizer 34, an inverse adaptive quantizer 36, first and second adaptive predictors 38 and 40, a coefficient storage memory 42 and first and second adders 44 and 46. The input signal sample $S_j$ is provided as one input to a substractor 30 where it is compared to a predicted value $R_{2j}$ with the difference signal being provided as one input to the subtractor 32 where it is compared with the predicted value $R_{1j}$. The error signal output E from the subtractor 32 is provided to the adaptive quantizer 34 which quantizes the error signal E in an adaptive manner with the quantization step size being controlled by a signal on line 48. The quantized error signal is then provided on line 50 to an encoder, such as a conventional PCM encoder (not shown), and is also provided as an input to the memory 42. The memory 42, as is well known, may include a look-up table storing a plurality of step size multipliers M(I) corresponding to various quantizer output levels I, so that the memory 42 will provide as an output a signal on line 48 which will control the step size $\Delta_j$ in the quantizer 34.

The quantized error signal is further provided to the inverse quantizer 36 which functions to provide as an output the original error signal in the form of a recovered error signal $E_j$. If a PCM encoder is incorporated within quantizer 34, a decoder will have to be included in the inverse quantizer 36. As is well known, the step size multiplier in the inverse quantizer 36 must correspond to that for the quantizer 34, so that the output from memory 42 is provided in common to both the quantizer 34 and inverse quantizer 36.

The reconstructed error signal $\hat{E}_j$ is provided as one input to an adder 44 where it is added to the output from an adaptive inside predictor 38 to obtain a first intermediate signal $\hat{S}_{1j}$, which is then provided as an input to adder 46 and combined with the output of an outside predictor 40 to obtain a second intermediate signal $\hat{S}_j$ which corresponds to the locally decoded input signal. The inside and outside predictors 38 and 40 generate first and second prediction values $R_{1j}$ and $R_{2j}$ which are provided to respective multipliers 32 and 30. The predictors 38 and 40 are well-known adaptive predictors.

The quantizer 34 is a symmetrical quantizer having 2 N levels, and the parameters $\xi_i$ and $\eta_i$, i = 1, 2, ..., N are predetermined in a known manner to correspond to the optimal step size for zero mean and unit variance of the input distribution. $\Delta_j$ is the scale factor which determines the quantizer step size at the j-th sampling instant, and decision boundaries and reconstruction levels are given by $\Delta_j \cdot \xi_i$ and $\Delta_j \cdot \eta_i$, respectively, as is well known.

In accordance with the present invention, a first improvement is a modified leaky quantizer. The choice of the leakage coefficient can significantly affect the performance of the quantizer, and to improve error robustness without sacrificing dynamic range and adaptation speed, a modified adaptation algorithm is provided. A number of preceding step size multipliers are stored in the memory 42, and the new quantization scale is adjusted in accordance with these preceding multiplier values.

In accordance with the present invention, the quantization scale adaptation algorithm (2) is modified to:

$$\Delta_{j+1} = \Delta_j^{(1-\alpha)} M(I_j) / \{M(I_{j-K1})^{C_{1j}} \cdot M(I_{j-K2})^{C_{2j}}\}, \quad (3)$$

where K1 and K2 are predetermined parameters denoting the sampling index at which particular multipliers are stored in the memory 42. K1 and K2 are empirically chosen to represent sample values far enough apart to properly reflect past history. $C_{ij}$ (i = 1, 2) are given by $$C_{ij} = \quad 0.0 \text{ if } M(I_{j-Ki}) \leq 1.0, \quad (4)$$

$$0.0 \text{ if } \prod_{r=1}^{Ki} M(I_{j-r}) \leq Th_i,$$

when $M(I_{j-Ki}) > 1.0$, $\gamma_i$ otherwise, where $\gamma_i$ are predetermined parameters empirically chosen to obtain a desired result of fast convergence of detected error, and $Th_i$ are thresholds for multiplications of multipliers being stored in the memory 42. By considering Log $\Delta_j$ and Log $M(I_j)$ as variables, the transfer function of equation (3) in Z transform notation is given by $$H(Z) = \frac{1 - C_{ij} \cdot Z^{-k1} - C_{2j} \cdot Z^{-k2}}{1 - (1 - \alpha)Z^{-1}} \cdot Z^{-1} \quad (5)$$

Equation (5) indicates that zero points will be inserted into the leaky integration, depending upon the values of the multipliers stored in the memory 42.

When $$\prod_{r=1}^{Ki} M(I_{j-r}) > Th_i \text{ and } M(I_{j-Ki}) > 1.0, \quad (6)$$

H(Z) is more attenuated near the zero frequency than $H_0(Z)$ given by $$H_0(Z) = \frac{Z^{-1}}{1 - (1 - \alpha)Z^{-1}}. \quad (7)$$

Thus, H(Z) is more leaky than $H_0(Z)$. This is equivalent to inserting a large leakage initially upon error detection in the adaptation algorithm for $\Delta_j$.

The occurrence probabilities of the multiplier values, Pr[M(I)]; I = 1, 2, ..., N are given by the stationary step-occupancy probabilities;

$$Pr[M(I)] = Pr[\xi_{I-1} \Delta_j \leq E_j < \xi_I \Delta_j]. \quad (8)$$

Paying attention to the difference among step-occupancy probabilities for the 4-bit quantizer, in general, $$Pr[M(I) \leq 1.0] > Pr[M(I) > 1.0], \tag{9}$$

and $$\frac{Pr[M(8) \text{ or } M(7)]}{Pr[M(I) \leq 1.0]} \simeq 10^{-1}, \tag{10}$$

under the assumption that $M(I) \leq 1.0$ for $I \leq 4$. With this in mind, $Th_i$ should be set at a value which causes $$Pr\left[\prod_{r=1}^{Ki} M(I_{j-r}) > Th_i\right]$$

to be small for the $K_i$ multipliers in the encoder.

If $M(I_{j-r})$ exceeds $Th_i$ and $M(I'_{j-K1}) > 1.0$ in the decoder, $M(I'_{j-K1})$ may be regarded as having been corrupted by channel errors and then the multiplier is adjusted by (3) and (4). The small leakage of $\alpha$ can diminish the effects caused by erroneous adjustment, even if the decision was made erroneously in (4).

A second improvement according to the present invention is the novel configuration of the feedback adaptive predictor. The choice of the predictor can significantly affect the performance of an ADPCM encoder, and an adaptive predictor with feedback estimation has been shown to yield better performance than a fixed predictor under error free conditions of the channel, transmitting voice signals of various different languages or transmitting high speed voice band data.

The predictor according to the present invention employs two second order adaptive predictors operating in inside and outside feedback loops and connected in parallel. The coefficients of the predictors are sequentially updated by a steepest descent algorithm, and the adaptation algorithm for the inside predictor is modified to achieve an improved error robustness. Predictor outputs for the inside and outside loops are respectively given by $$R_{1j} = \sum_{i=1}^{2} a_1(i) \cdot \hat{S}_{1j-i} \tag{11}$$

$$R_{2j} = \sum_{i=1}^{2} a_2(i) \cdot \hat{S}_{j-i} \tag{12}$$

where $a_1(i)$ and $a_2(i)$ are coefficients of the i-th tap at the j-th sampling index. $\hat{S}_{1j}$ is the input signal of the inside predictor and $\hat{S}_j$ denotes the locally decoded signal.

For the outside predictor, coefficients are updated by $$a_{j+1}(i) = (1 - \beta_2)a_j(i) + g_2\hat{S}_{1j}\hat{S}_{j-i}\bigg/\left(\sum_{h=1}^{4} \hat{S}_{j-h}^2 + 5\right), \tag{13}$$

$i = 1, 2,$ where $g_2$ is introduced to control the convergence rate. $(1 - \beta_2)$ is a leakage coefficient to diminish the effect of channel errors on the predictor coefficient.

For the inside predictor, the coefficients are similarly updated by $$a_{1j+1}(i) = (1 - \beta_1)a_{1j}(i) + g_1 V_j \hat{S}_{1j-i}\bigg/\sqrt{\sum_{h=1}^{4} \hat{S}_{1j-h}^2 + 5}, \tag{14}$$

$$V_j = \text{sgn}(\hat{E}) \cdot \eta_i, i = 1, 2,$$

where as before $(1-\beta_1)$ represents leakage and $g_1$ is a convergence rate parameter. $g_1$ and $g_2$ are chosen in a well-known manner according to control theory. $V_j$ is the quantizer output level with unit variance, i.e. depending only on the output code word. Using $V_j$ instead of $\hat{E}_j$ makes the inside adaptive predictor more robust to channel errors then the conventional adaptation algorithm, because $V'_j$ is only corrupted once by a channel error and not at other sampling indices in the decoder, whereas $\hat{E}'_j$ results from values of the scale factor in the decoder, $\Delta'_j$, which are influenced by channel errors at other time indices.

Simulation was conducted to assess the objective performance of the proposed robust 32-kbps ADPCM encoding schemes in terms of signal to noise ratio. The long-term averaged signal to noise ratio, SNRL, and the segmental signal to noise ratio, SNRS, were used. SNRS was computed in short-time (10 ms) segments. Speech source materials recorded through a telephone handset were prepared. Four speech segments of English and Japanese sentences spoken by a male and a female for seven seconds length were sampled at 8 kHz. Random channel errors were introduced into the decoder with error rate, $P_e$, of $10^{-3}$.

Table 1 shows comparison of performance of SNR among 32-kbps ADPCM encoding schemes for the English sentences by a male. ADPP denotes 2nd order adaptive predictors in parallel, in which the coefficients of both predictors were respectively updated by the conventional steepest descent algorithm given by (13). $\beta = 2^{-7}$ and $g = 0.05$ were used for both predictors. ADPPM also denotes 2nd order adaptive predictors in parallel, in which coefficients of the inside predictor were adjusted by a modified adaptation algorithm given by (14). $\beta_1 = 2^{-7}$, $g_1 = 0.01$, $\beta_2 = 2^{-7}$ and $g_2 = 0.05$ were used in (13) and (14). FIP denotes a first order fixed predictor with $a_1$ of 0.85. MLQ denotes the modified leaky adaptive quantizer given by (3) and (4). $\gamma_1 = \gamma_2 = 0.2$, $Th_1 = Th_2 = 1.8$, $K1 = 8$, $K2 = 16$ and $\alpha = 2^{-8}$ were used. LQ is a leaky adaptive quantizer with $\alpha = 2^{-8}$ given by (2).

TABLE 1

Comparison of performance of SNR among 32-kbps ADPCM encoding schemes for an English sentence by a male.

| ENCODING SCHEME | | $P_e = 0.0$ | | $P_e = 10^{-3}$ | |
|---|---|---|---|---|---|
| | | SNRS | SNRL (dB) | SNRS | SNRL (dB) |
| ADPCM | ADPPM-MLQ | 24.4 | 25.2 | 17.1 | 12.6 |
| | ADPPM-LQ | 24.1 | 25.0 | 14.7 | 10.0 |
| | ADPP-MLQ | 24.7 | 26.0 | 16.5 | 11.9 |
| | ADPP-LQ | 24.6 | 25.7 | 13.0 | 6.5 |
| | FIP-MLQ | 23.8 | 23.6 | 18.3 | 10.9 |
| | FIP-LQ | 23.7 | 23.6 | 15.5 | 7.9 |

In comparison with the first order fixed predictor (FIP-LQ), ADPP-LQ still has a disadvantage of about 2 dB in SNR at $P_e = 10^{-3}$ in spite of attaining higher SNR at $P_e = 0$, as shown in Table 1. By modifying the adaptation algorithm for the inner predictor, SNRS and SNRL of ADPPM-LQ were improved 1.7 dB and 3.5 dB at $P_e=10^{-3}$, respectively, as compared to conventional adaptive prediction scheme. However, the modification decreased SNRS and SNRL 0.5 dB and 0.7 dB at $P_e=0$, respectively.

Addition of the modified leaky quantizer scheme (ADPPM-LQ) resulted in improvement of SNRS and SNRL 2.4 to 3.5 dB and 2.6 to 4.4 dB, respectively, at $P_e=10^{-3}$ without sacrifice of SNR degradation at $P_e=0$. The encoding scheme of this invention proved more robust than the conventional ADPCM scheme with the fixed predictor and the leaky quantizer.

TABLE 2

Comparison of performance of SNR between the robust ADPCM according to this invention and the ADPCM with first order fixed predictor. ($\Delta_{max}/\Delta_{min} = 69.5$ dB)

| | | $P_e = 0.0$ | | $P_e = 10^{-3}$ | |
|---|---|---|---|---|---|
| SOURCE | ENCODING SCHEME | SNRS | SNRL (dB) | SNRS | SNRL (dB) |
| ENGLISH | ADPPM-MLQ | 24.4 | 25.2 | 17.1 | 12.6 |
| MALE | FIP-LQ | 23.7 | 23.6 | 15.5 | 7.9 |
| ENGLISH | ADPPM-MLQ | 23.8 | 22.9 | 17.0 | 11.7 |
| FEMALE | FIP-LQ | 22.8 | 21.2 | 15.3 | 7.1 |
| JAPANESE | ADPPM-MLQ | 21.8 | 21.9 | 15.9 | 10.1 |
| MALE | FIP-LQ | 21.1 | 21.3 | 12.7 | 7.0 |
| JAPANESE | ADPPM-MLQ | 22.7 | 24.5 | 16.0 | 12.0 |
| FEMALE | FIP-LQ | 21.2 | 22.5 | 12.2 | 7.9 |

Table 2 shows comparison of performance in terms of SNR between ADPPM-MLQ and the conventional ADPCM with first order fixed predictor (FIP-LQ) for four of sentences. Robustness of ADPCM-MLQ to channel errors was improved 1.6 to 3.8 dB for SNRS and 3.1 to 4.7 dB for SNRL at $P_e=10^{-3}$, as compared to FIP-LQ. For whole sentences, an advantage in SNR for ADPPM-MLQ was achieved at $P_e=0$ and $10^{-3}$. Large improvements in SNRL in ADPPM-MLQ mean that the large degradation due to channel errors can be recovered quickly.

TABLE 3

Performance of ADPPM-MLQ and ADPPM-LQ on SNR for a small leakage parameter on an English sentence by a male. ($\Delta_{max}/\Delta_{min} = 69.5$ dB)

| | | ADPPM-MLQ | | ADPPM-LQ | |
|---|---|---|---|---|---|
| | $P_e$ | $\alpha = 2^{-8}$ | $\alpha = 2^{-7}$ | $\alpha = 2^{-8}$ | $\alpha = 2^{-7}$ |
| SNRS | 0.0 | 24.4 | 24.3 | 24.1 | 24.2 |
| (dB) | $10^{-3}$ | 17.1 | 18.6 | 14.7 | 16.7 |
| SNRL | 0.0 | 25.2 | 25.0 | 25.0 | 25.1 |
| (dB) | $10^{-3}$ | 12.6 | 14.7 | 10.0 | 11.8 |

Table 3 shows the performance of ADPPM-MLQ and ADPPM-LQ for SNR for a small leakage parameter $\alpha$ on an English sentence by a male. Improvement in SNR can be obtained by the modified leaky quantization scheme at $P_e=10^{-3}$ without large scarifice of either the dynamic range or the adaptation speed.

TABLE 4

SNRS and SNRL for a restricted dynamic range of ADPPM-MLQ and ADPPM-LQ schemes for an English sentence by a male. ($\alpha = 2^{-8}$)

| | | ADPPM-MLQ $\Delta_{max}/\Delta_{min}$ (dB) | | | ADPPM-LQ $\Delta_{max}/\Delta_{min}$ (dB) | | |
|---|---|---|---|---|---|---|---|
| SNR | $P_e$ | 69.5 | 63.5 | 60.0 | 69.5 | 63.5 | 60.0 |
| SNRS | 0.0 | 24.4 | 24.3 | 24.4 | 24.1 | 24.2 | 24.2 |
| (dB) | $10^{-3}$ | 17.1 | 18.6 | 17.6 | 14.7 | 15.2 | 16.3 |
| SNRL | 0.0 | 25.2 | 25.0 | 25.2 | 25.0 | 25.0 | 25.1 |
| (dB) | $10^{-3}$ | 12.6 | 14.9 | 15.5 | 10.0 | 12.1 | 14.8 |

Table 4 shows SNRS and SNRL for the constrained dynamic range of ADPCM-MLQ and ADPPM-LQ encoding schemes. The modified algorithm for the scale adaptation in the quantizer can be considered to serve as a mechanism for recovery from channel errors by detecting unusual occurrence of large multipliers inside the specified range between $\Delta_{max}$ and $\Delta_{min}$. Channel error suppression can also be achieved by forcing the scale to saturate outside the range of refraction. The scheme according to this invention is very effective for a signal having a wide power distribution to improve the robustness. For the range restricted to 63.5 dB, the modified leaky quantizer resulted in 3.4 dB and 2.8 dB advantages in SNRS and SNRL, compared to the conventional leaky quantizer. For the restricted range of $\Delta_{max}/\Delta_{min}$ of 60 dB, the improvement on SNR was decreased, compared to other wide ranges. Further improvement would be realized by optimizing the parameters in (4).

With the improved encoder having a modified leaky quantizer and dual predictors one of which has a modified adaptation algorithm, improved error robustness can be achieved without sacrificing dynamic range or SNR. With such a configuration, a small leakage is maintained at all times with a large leakage being inserted only upon the occurrence of an error. Thus, large SNR degradation due to channel errors can be recovered by readjustment of the received multiplier after detecting an unusual occurrence of large multipliers inside a prespecified range of $\Delta_{max}$ and $\Delta_{min}$. The addition of the modified leaky quantizer does not cause any degradation in segmental or long term average SNRs for an error free channel.

We claim:

1. An adaptive quantizer of the type receiving input signal samples and quantizing said samples in accordance with a plurality of quantizing steps, and wherein said adaptive quantizer includes means for varying the size of said quantizing steps in accordance with an adaptation algorithm, the improvement characterized in that said means for varying said quantizing step sizes comprises varying means for varying said quantizing step sizes in accordance with a plurality of preceding quantizer outputs and wherein said varying means provides at least a small leakage in its step size variation at all times and a larger leakage in its step size variation in response to the occurrence of an error in the quantizer output.

2. In an Adaptive Differential Pulse Code Modulation (ADPCM) encoder of the type wherein a sequence of input signal samples are received and compared in comparison means with at least one predicted value to obtain a difference signal, a quantizer receives and quantizes said difference signal according to a plurality of quantization levels and feedback means generates said at least one predicted value in accordance with the values of a series of said difference signals, the improvement characterized in that:

said feedback means comprises first prediction means for generating a first prediction value in accordance with a series of values of said difference signal and for generating a first intermediate signal, and second prediction means for generating a second prediction value in accordance with a series of said first intermediate signals; and said quantizer comprises an adaptive quantizer varying its quantizing steps in accordance with a plurality of preceding quantizer outputs, said adaptive quantizer varying said quantizing step sizes in accordance with an adaptation algorithm and providing at least a small leakage in its step size variation at all times and a larger leakage in its step size variation in response to the occurrence of an error in said quantizer output.

3. An adaptive quantizer as defined in claim 1, wherein said adaptation algorithm for defining the quantization step size is given by $$\Delta_{j+1} = \Delta_j^{(1-\alpha)} M(I_j)/\{M(I_{j-K1})^{C1j} \cdot M(I_{j-K2})^{C2j}\},$$

where $\Delta_{j+1}$ is the current quantizing step size, $\Delta_j$ is the previous quantizing step size, $(1-\alpha)$ is a leakage coefficient, $M(I_j)$ is a step size multiplier which is a function of the level $I_j$ of the quantizer output, K1 and K2 are predetermined integers and $C_{ij}(i=1, 2)$ are given by $$C_{ij} = \begin{array}{l} 0.0 \text{ if } M(I_{j-Ki}) \leq 1.0, \\ 0.0 \text{ if } \prod_{r=1}^{Ki} M(I_{j-r}) \leq Th_i, \\ \text{when } M(I_{j-Ki}) > 1.0, \\ \gamma_i \text{ otherwise,} \end{array} \quad (4)$$

where $\gamma_i$ are predetermined parameters and $Th_i$ are threshold levels.

4. In an Adaptive Differential Pulse Code Modulation (ADPCM) encoder of the type wherein a sequence of input signal samples are received and compared in comparison means with at least one predicted value to obtain a difference signal, a quantizer receives and quantizes said difference signal according to a plurality of quantization levels and feedback means generates said at least one predicted value in accordance with the values of a series of said difference signals, the improvement characterized in that said feedback means comprises:
   first adaptive prediction means for generating a first prediction value from a series of values of said difference signal in accordance with coefficients defined according to a first adaptation algorithm, and for generating a first intermediate signal; and
   second prediction means for generating a second prediction value from a series of said first intermediate signals in accordance with coefficients defined according to a second adaptation algorithm different from said first adaptation algorithm.

5. An encoder as defined in claim 4, wherein said first prediction means comprises:
   a first adder for receiving as a first input signal a signal representing said difference signal and for receiving a second input signal, the output of said adder comprising said first intermediate signal; and
   a first predictor for receiving said first intermediate value and generating said first prediction value in accordance with a sequence of said first intermediate values, the output of said first predictor being provided as the second input to said first adder.

6. An encoder as defined in claim 4, wherein said second prediction means comprises:
   a second adder for receiving as a first input said intermediate signal and for receiving a second input, the output of said second adder comprising a decoded input signal sample; and
   a second predictor for receiving said decoded input signal sample and generating said second prediction value in accordance with a sequence of said decoded input signal samples, the output of said second predictor being provided as said second input to said second adder.

7. An encoder as defined in any one of claims 4–6, wherein said comparison means comprises a first subtractor for subtracting said second predicted value from an input signal sample and a second subtractor for subtracting said first prediction value from the output of said first subtractor in order to obtain said difference signal.

8. An encoder as defined in claim 5, wherein said first prediction value $R_{1j}$ given by $$R_{1j} = \sum_{i=1}^{2} a_{1j}(i) \cdot \hat{S}_{1j-i},$$

where $a_{1j}(i)$ is the coefficient of an i-th tap at a j-th sampling index and $S_{1j}$ is said first intermediate signal.

9. An encoder as defined in claim 5, wherein said second prediction value is defined by $$R_{2j} = \sum_{i=1}^{2} a_{2j}(i) \cdot \hat{S}_{j-i},$$

where $a_{2j}(i)$ is the coefficient of an i-th tap at a j-th sampling index, and $\hat{S}_j$ is said locally decoded input signal sample.

10. An encoder as defined in claim 8, wherein said first predictor is an adaptive predictor whose coefficients are updated by:

$$a_{1j+1}(i) = (1 - \beta_1)a_{1j}(i) + g_1 V_j \hat{S}_{1j-i}/\sqrt{\sum_{h=1}^{4} \hat{S}_{1j-h}^2 + 5},$$

$$V_j = \text{sgn}(\hat{E}) \cdot \eta_i; \, i = 1, 2,$$

where $(1-\beta_1)$ represents a leakage factor, $g_1$ is a predetermined convergence rate parameter, $V_j$ is a quantizer output level with unit variance, $\hat{E}_j$ is a signal representing said error signal value and $\xi_i$ and $\eta_i$ are parameters defining optimal step size for zero mean and unit variance of the distribution of input signal samples.

11. An encoder as defined in claim 10, wherein said second predictor is an adaptive predictor whose coefficients are updated by:

$$a_{j+1}(i) = (1 - \beta_2)a_j(i) + g_2 \hat{S}_j \hat{S}_{j-i}/\left(\sum_{h=1}^{4} \hat{S}_{j-h}^2 + 5\right);$$

$$i = 1, 2,$$

where $g_2$ is a predetermined convergence rate parameter.

12. An encoder as defined in claim 5, further comprising an inverse quantizer for receiving the output of said quantizer and providing said difference signal value to said first adder.

13. An encoder as defined in claim 4, wherein said quantizer is an adaptive quantizer varying its quantizing step sizes in accordance with a plurality of preceding quantizer outputs.

14. An encoder as defined in claim 13, wherein said adaptive quantizer varies said step sizes in accordance with an adaptation algorithm and provides at least a small leakage in its step size variation at all times and a larger leakage in its step size variation in response to the occurrence of an error in said quantizer output.

* * * * *